(12) United States Patent
Zou et al.

(10) Patent No.: US 9,306,581 B2
(45) Date of Patent: Apr. 5, 2016

(54) SYNCHRONIZATION SIGNAL PROCESSING METHOD AND APPARATUS

(71) Applicant: Huawei Technologies Co., Ltd., Shenzhen (CN)

(72) Inventors: Jianlong Zou, Nuremberg (DE); Yong Xi, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 209 days.

(21) Appl. No.: 14/133,972

(22) Filed: Dec. 19, 2013

(65) Prior Publication Data

US 2014/0103974 A1  Apr. 17, 2014

Related U.S. Application Data

(63) Continuation of application No. PCT/CN2012/083668, filed on Oct. 29, 2012.

(30) Foreign Application Priority Data

Feb. 13, 2012  (CN) .......................... 2012 1 0031522

(51) Int. Cl.
   *H03L 7/08*   (2006.01)
   *H03K 5/1536*  (2006.01)
   *G01R 19/175*  (2006.01)
   *H02J 3/40*   (2006.01)

(52) U.S. Cl.
   CPC ................ *H03L 7/08* (2013.01); *H03K 5/1536* (2013.01); *G01R 19/175* (2013.01); *H02J 3/40* (2013.01)

(58) Field of Classification Search
   CPC .......... H03L 7/08; H03K 5/1536; H03K 3/78; H02J 3/40; G01R 19/175
   See application file for complete search history.

(56) References Cited

U.S. PATENT DOCUMENTS 6,137,536 A   10/2000  Yamaguchi
7,362,149 B1   4/2008  Cheah et al.
(Continued)

FOREIGN PATENT DOCUMENTS

CA   2628211 A1   1/2003
CN   1237307 A   12/1999
(Continued)

OTHER PUBLICATIONS

Foreign Communication From a Counterpart Application, European Application No. 12868522.9, Extended European Search Report dated Sep. 30, 2014, 7 pages.
(Continued)

*Primary Examiner* — Thuan Du
(74) *Attorney, Agent, or Firm* — Conley Rose, P.C.; Grant Rodolph; Nicholas K. Beaulieu

(57) ABSTRACT

The present invention provides a synchronization signal processing method and apparatus, which solves problems of low accuracy and a slow speed of synchronization operation executed on the synchronization signal. The specific steps include: acquiring multiple to-be-processed signals of a power supply, where the to-be-processed signals are signals changing periodically; generating a synchronization signal that has the same period as the to-be-processed signals by generating pulses in each period of the to-be-processed signals, where each period of the synchronization signal includes at least two pulses; detecting whether the synchronization signal is normal by determining whether parameters of all the pulses in the synchronization signal are accurate; and if the synchronization signal is normal, synchronizing the to-be-processed signals by performing time alignment on the pulses in the synchronization signal. The synchronization signal processing method and apparatus can be applied in a synchronization operation between signals.

4 Claims, 11 Drawing Sheets

(56) References Cited

U.S. PATENT DOCUMENTS

| | | | |
|---|---|---|---|
| 8,217,640 B2* | 7/2012 | Tazzari | G01R 29/18 324/66 |
| 2009/0213627 A1* | 8/2009 | Chen | H02M 7/219 363/74 |
| 2011/0129039 A1 | 6/2011 | Yamazaki | |
| 2011/0169531 A1 | 7/2011 | Scholder | |
| 2012/0287342 A1 | 11/2012 | Matsui | |

FOREIGN PATENT DOCUMENTS

| | | | |
|---|---|---|---|
| CN | 101378453 A | 3/2009 |
| CN | 101742078 A | 6/2010 |
| CN | 102075072 A | 5/2011 |
| CN | 102594304 A | 7/2012 |
| JP | 2008172978 A | 7/2008 |

OTHER PUBLICATIONS

Foreign Communication From a Counterpart Application, PCT Application No. PCT/CN2012/083668, English Translation of International Search Report dated Feb. 7, 2013, 2 pages.

Foreign Communication From a Counterpart Application, PCT Application No. PCT/CN2012/083668, Written Opinion dated Feb. 7, 2013, 4 pages.

Foreign Communication From a Counterpart Application, Chinese Application No. 201210031522.9, Chinese Office Action dated Mar. 18, 2014, 17 pages.

* cited by examiner

SYNCHRONIZATION SIGNAL PROCESSING METHOD AND APPARATUS

CROSS-REFERENCE TO RELATED APPLICATIONS

This application is a continuation of International Application No. PCT/CN2012/083668, filed on Oct. 29, 2012, which claims priority to Chinese Patent Application No. 201210031522.9, filed on Feb. 13, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of power supply technologies, and in particular, to a synchronization signal processing method and apparatus between multiple power supplies.

BACKGROUND

In a power supply system, in order to implement a synchronization operation among more than two power supplies, it is required to send a synchronization signal to the power supplies, so that the power supplies track the synchronization signal.

A synchronization operation among more than two power supplies may be implemented by synchronizing the synchronization signal, that is, by synchronizing original signals in the more than two power supplies, where the synchronization signal is a signal that has the same period as the original signal.

There are many manners for generating the synchronization signal, which may include: acquiring positive zero-crossing points/negative zero-crossing points of the original signals by adopting hardware or software, and generating pulses with the same width at the positive zero-crossing points corresponding to the original signals, where a rising edge/a falling edge of the pulses is aligned with the positive zero-crossing point; alternatively, generating pulses with the same width at the negative zero-crossing points corresponding to the original signals, where the rising edge/the falling edge of the pulses is aligned with the negative zero-crossing point; thereby, a signal formed by the pulses is the synchronization signal of the original signals, and only one pulse is included in each period of the synchronization signal.

Generally, after the synchronization signal is generated, the synchronization operation performed on the synchronization signal may include: detecting the synchronization signal and synchronizing the synchronization signal.

Before the original signals are synchronized, it is first required to first detect the synchronization signal of the original signals, and determine whether a time interval between the rising edges/the falling edges of every two pulses in the synchronization signal is within a preset range. If the interval is within the preset range, it indicates that the synchronization signal is normal; and if the interval is not within the preset range, it indicates that the synchronization signal is abnormal.

If the synchronization signal is normal, time alignment is performed on the pulses in the synchronization signals of two power supplies, so as to implement the synchronization operation between the two power supplies, where the number of the pulses included in the synchronization signal is the number of times the synchronization signal is detected and the number of times the synchronization signal is synchronized.

The prior art at least has the following problems: the synchronization signal is a signal that has the same period as the original signal, and one period of the synchronization signal only includes one pulse; therefore, in one period of the original signal, that is, in one period corresponding to the synchronization signal of the original signal, the synchronization operation can only be performed on the synchronization signal once, thereby leading to a slow speed of executing the synchronization operation. For the method for determining whether the time interval between the rising edges/the falling edges of the two pulses in the synchronization signal is within the preset range in the prior art, it only can be determined whether the time interval between the pulses is normal, and it cannot be determined whether a certain pulse is normal, resulting in low accuracy in executing the synchronization operation.

SUMMARY

Embodiments of the present invention provide a synchronization signal processing method and apparatus, so as to solve problems of low accuracy and a slow speed of synchronization operation performed on the synchronization signal.

To achieve the foregoing objective, embodiments of the present invention adopt the following technical solutions.

A synchronization signal processing method is provided, including: acquiring multiple to-be-processed signals of a power supply, where the to-be-processed signals are signals changing periodically; generating a synchronization signal that has the same period as the to-be-processed signals by generating pulses in each period of the to-be-processed signals, where at least two pulses are included in each period of the synchronization signal; detecting whether the synchronization signal is normal by determining whether parameters of all the pulses in the synchronization signal are accurate; and if the synchronization signal is normal, performing time alignment on the pulses in the synchronization signal, so as to synchronize the to-be-processed signals.

A synchronization signal processing method is provided, including: acquiring multiple to-be-processed signals of a power supply, where the to-be-processed signals are signals changing periodically; generating a synchronization signal that has the same period as the to-be-processed signals by generating pulses in each period of the to-be-processed signals, where the to-be-processed signals include at least one of the pulses; detecting whether the synchronization signal is normal by determining whether widths of all the pulses in the synchronization signal are within a preset range; and if the synchronization signal is normal, performing time alignment on the pulses in the synchronization signal, so as to synchronize the to-be-processed signals.

A synchronization signal processing apparatus is provided, including: a first acquisition unit configured to acquire multiple to-be-processed signals of a power supply, where the to-be-processed signals are signals changing periodically; a first generation unit configured to generate a synchronization signal that has the same period as the to-be-processed signals by generating pulses in each period of the to-be-processed signals and acquired by the first acquisition unit, where at least two pulses are included in each period of the synchronization signal; a first detection unit configured to detect whether the synchronization signal is normal by determining whether parameters of all the pulses in the synchronization signal generated by the first generation unit are accurate; and a first synchronization unit configured to perform time alignment on the pulses in the synchronization signal if the first detection unit detects that the synchronization signal is normal, so as to synchronize the to-be-processed signals.

A synchronization signal processing apparatus is provided, including: a second acquisition unit configured to acquire multiple to-be-processed signals of a power supply, where the to-be-processed signals are signals changing periodically; a second generation unit configured to generate a synchronization signal that has the same period as the to-be-processed signals by generating pulses in each period of the to-be-processed signals and acquired by the second acquisition unit, where the to-be-processed signals include at least one of the pulses; a second detection unit configured to detect whether the synchronization signal is normal by determining whether widths of all the pulses in the synchronization signal generated by the second generation unit are within a preset range; and a second synchronization unit configured to perform time alignment on the pulses in the synchronization signal if the second detection unit detects that the synchronization signal is normal, so as to synchronize the to-be-processed signals.

In the synchronization signal processing method and apparatus provided in the embodiments of the present invention, synchronization of multiple to-be-processed signals of a power supply is implemented through a method for synchronizing the synchronization signal. In order to more accurately synchronize the to-be-processed signals, the synchronization signal is first detected before the to-be-processed signals are synchronized, where the detecting the synchronization signal is specifically performed by determining whether the pulses included in the synchronization signal are normal, and the number of the pulses included in the synchronization signal is the number of times the synchronization operation is executed on the synchronization signal.

After the foregoing solutions are adopted, at least two pulses are included in each period of the synchronization signal, so that in one period of the synchronization signal, the synchronization operation may be performed on the synchronization signal at least twice, thereby improving accuracy and a speed of execution of the synchronization operation.

BRIEF DESCRIPTION OF THE DRAWINGS

To describe the technical solutions in the embodiment of the present invention more clearly, the following briefly introduces the accompanying drawings for describing the embodiment. The accompanying drawings in the following description show merely some embodiment of the present invention, and persons of ordinary skill in the art may still derive other drawings from the accompanying drawings without creative efforts.

DETAILED DESCRIPTION

The following clearly describes the technical solutions in the embodiment of the present invention with reference to the accompanying drawings in the embodiment of the present invention. The described embodiment is merely a part rather than all of the embodiments of the present invention. All other embodiments obtained by persons of ordinary skill in the art based on the embodiment of the present invention without creative efforts shall fall within the protection scope of the present invention.

Figure 1:
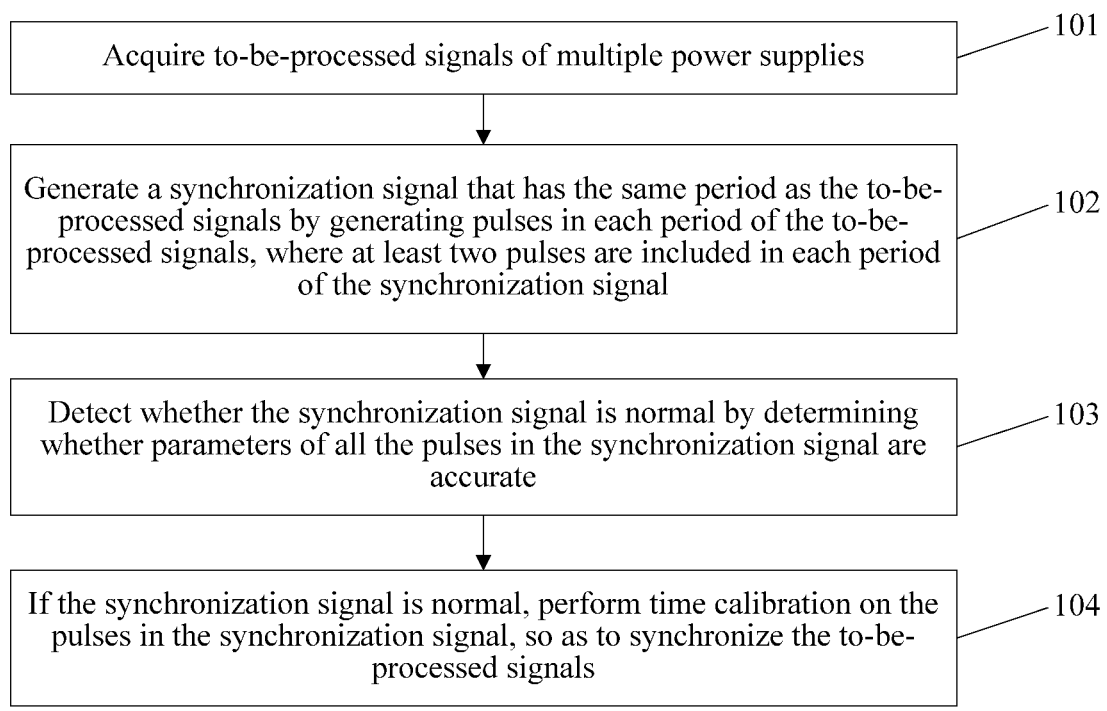
FIG. 1 is a flow chart of a synchronization signal processing method provided in an embodiment.

This embodiment provides a synchronization signal processing method, which is shown in FIG. 1, and includes the following steps.

101: Acquire multiple to-be-processed signals of a power supply.

Before the to-be-processed signals are synchronized, a synchronization signal of the to-be-processed signals is generated according to the to-be-processed signals, and synchronization of the to-be-processed signals is implemented through a method for synchronizing the synchronization signal of the to-be-processed signals, where the to-be-processed signals are signals changing periodically.

In order to form a basis for the following steps, the to-be-processed signals are first acquired.

102: Generate a synchronization signal that has the same period as the to-be-processed signals by generating pulses in each period of the to-be-processed signals, where at least two pulses are included in each period of the synchronization signal.

The synchronization signal that has the same period as the to-be-processed signals is generated according to the to-be-processed signals.

The synchronization operation executed on the synchronization signal may include: synchronizing the synchronization signal and detecting the synchronization signal. The synchronization of the corresponding to-be-processed signals is implemented by synchronizing the synchronization signal.

Before the to-be-processed signals are synchronized by using the synchronization signal, it is further required to detect the synchronization signal, so as to ensure accuracy of the synchronization signal.

The number of the pulses included in one period of the synchronization signal is the number of times the synchronization operation is executed on the synchronization signal.

To implement that the number of times the synchronization operation can be executed on the synchronization signal at least twice in one period of the synchronization signal, at least two pulses are included in each period of the synchronization signal.

103: Detect whether the synchronization signal is normal by determining whether parameters of all the pulses in the synchronization signal are accurate.

The synchronization of the corresponding to-be-processed signals is implemented by synchronizing the synchronization signal. If the to-be-processed signals are synchronized by using an abnormal synchronization signal, abnormal synchronization of the to-be-processed signals is caused.

To more accurately synchronize the to-be-processed signals, it is first detected whether the synchronization signal is normal before the synchronization.

There are many specific synchronization signal detecting methods, for example: detecting whether a time interval between two rising edges/falling edges in the synchronization signal is within a preset range. If the interval is within the preset range, it indicates that the synchronization signal is normal; and if the interval is not within the preset range, it indicates that the synchronization signal is abnormal, and a parameter of the pulses at this time is an interval between pulses.

The parameters of the pulses are not limited in this embodiment, and may be set according to an actual requirement, so the details are not described herein again.

104: If the synchronization signal is normal, perform time alignment on the pulses in the synchronization signal, so as to synchronize the to-be-processed signals.

As an implementation manner of this embodiment, the synchronization of the to-be-processed signals is implemented by performing time alignment on the rising edge/the falling edge of the pulses in the synchronization signal.

The manner of time alignment performed on the synchronization signal is not limited in this embodiment, and may be any manner that is known by persons skilled in the art, so the details are not described herein again.

In the synchronization signal processing method provided in the embodiment of the present invention, synchronization of multiple to-be-processed signals of a power supply is implemented by using a method for synchronizing the synchronization signal. In order to more accurately synchronize the to-be-processed signals, the synchronization signal is first detected before the to-be-processed signals are synchronized, where the detecting the synchronization signal is specifically performed by determining whether the pulses included in the synchronization signal are normal, and the number of the pulses included in the synchronization signal is the number of times the synchronization operation is executed on the synchronization signal.

After the foregoing solutions are adopted, at least two pulses are included in each period of the synchronization signal, so that in one period of the synchronization signal, the synchronization operation may be performed on the synchronization signal at least twice, thereby improving accuracy and a speed of the synchronization operation.

Figure 2:
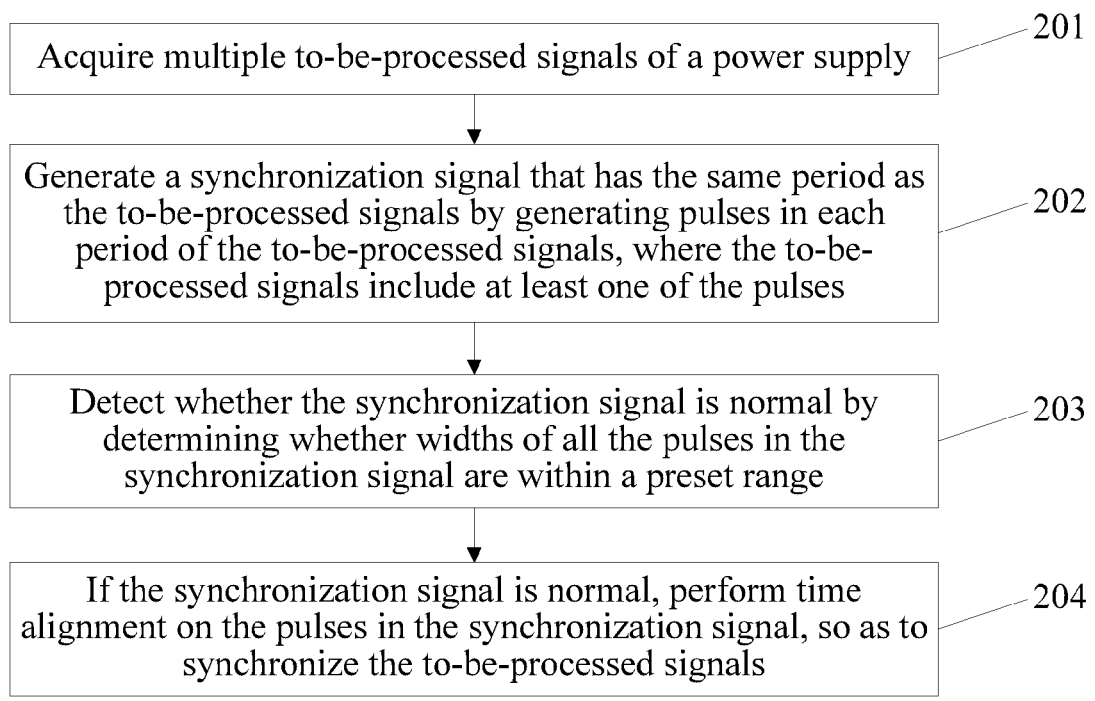
FIG. 2 is a flow chart of a synchronization signal processing method by detecting the synchronization signal in a manner of detecting a pulse width and a pulse order of the synchronization signal provided in an embodiment.

This embodiment provides a synchronization signal processing method, which is shown in FIG. 2, and includes the following steps:

201: Acquire multiple to-be-processed signals of a power supply.

Before the to-be-processed signals are synchronized, a synchronization signal of the to-be-processed signals is generated according to the to-be-processed signals, and synchronization of the to-be-processed signals is implemented by using a method for synchronizing the synchronization signal of the to-be-processed signals, where the to-be-processed signals are signals changing periodically.

In order to form a basis for the following steps, the to-be-processed signals are first acquired.

202: Generate a synchronization signal that has the same period as the to-be-processed signals by generating pulses in each period of the to-be-processed signals, where the to-be-processed signals include at least one of the pulses.

The synchronization signal of the to-be-processed signals is generated according to the to-be-processed signals.

The synchronization operation executed on the synchronization signal may include: synchronizing the synchronization signal and detecting the synchronization signal. Synchronization of the corresponding to-be-processed signals is implemented by synchronizing the synchronization signals, that is, multiple power supplies operate synchronously. Before the to-be-processed signals are synchronized by using the synchronization signal, it is further required to detect the synchronization signal, so as to ensure accuracy of the synchronization signal.

203: Detect whether the synchronization signal is normal by determining whether widths of all the pulses in the synchronization signal are within a preset range.

By synchronizing the synchronization signal, the synchronization of the corresponding to-be-processed signals is implemented, so as to enable multiple power supplies to operate synchronously. If the to-be-processed signals are synchronized by using an abnormal synchronization signal, abnormal synchronization of the to-be-processed signals is caused.

To more accurately synchronize the to-be-processed signals, whether the synchronization signal is normal is detected before the synchronization.

Specifically, it is determined whether a time interval between rising edges/falling edges of two pulses in the synchronization signal is within a preset range, and if the interval is not within the preset range, it indicates that the synchronization signal is abnormal. If the interval is within the preset range, it is determined whether widths of all the pulses in the synchronization signal are within a preset range. If the widths of all the pulses included in the synchronization signal are within the preset range, it indicates that the synchronization signal is normal. If not all the widths of the pulses included in the synchronization signal are within the preset range, it indicates that the synchronization signal is abnormal.

Further and optionally, if at least two pulses are included in each period of the synchronization signal, it may also be determined whether an arrangement order of all the pulses in the synchronization signal is correct according to the arrangement order of the pulses of the synchronization signal. If the arrangement order of all the pulses included in the synchronization signal is correct, it indicates that the synchronization signal is normal. If the arrangement order of all the pulses included in the synchronization signal is incorrect, it indicates that the synchronization signal is abnormal.

Alternatively, it is detected whether the synchronization signal is normal according to the pulse width and the pulse arrangement order of the synchronization signal.

The synchronization signal detecting method is not limited in this embodiment, and may be any method that is known by persons skilled in the art, so the details are not described herein again.

204: If the synchronization signal is normal, perform time alignment on the pulses in the synchronization signal, so as to synchronize the to-be-processed signals.

As an implementation manner of this embodiment, the synchronization signal is synchronized by performing time alignment on the rising edges/the falling edges of the pulses in the synchronization signal, so as to further implement synchronization of the to-be-processed signals.

The manner of time alignment performed on the synchronization signal is not limited in this embodiment, and may be any manner that is known by persons skilled in the art, so the details are not described herein again.

After the foregoing solutions are adopted, it can be determined whether the time interval between the multiple pulses in the synchronization signal is normal, and it can be further determined whether a single pulse in the synchronization signal is normal, thereby improving accuracy of the synchronization operation.

Figure 3:
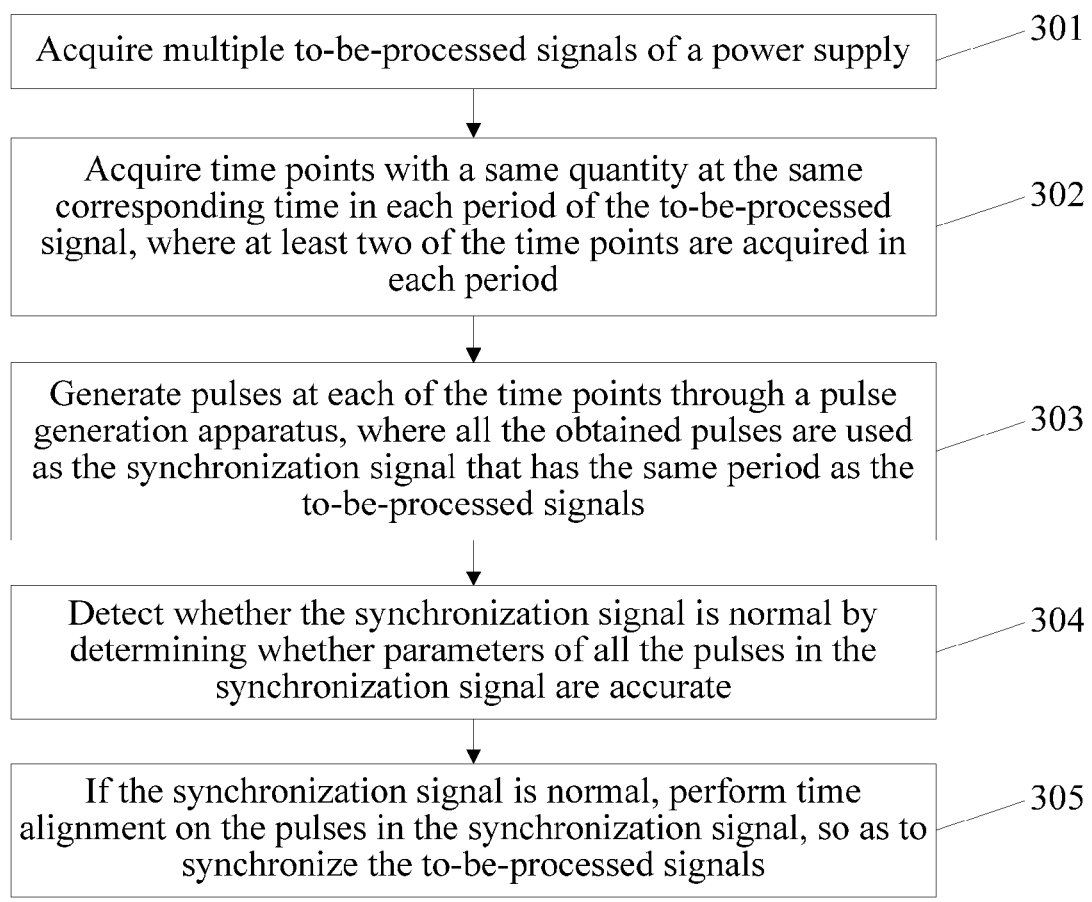
FIG. 3 is a flow chart of another synchronization signal processing method provided in an embodiment.

As an improvement of the embodiment, this embodiment provides another synchronization signal processing method, which is shown in FIG. 3, and includes the following steps:

301: Acquire multiple to-be-processed signals of a power supply.

Before the to-be-processed signals are synchronized, a synchronization signal of the to-be-processed signals is generated according to the to-be-processed signals, and synchronization of the to-be-processed signals is implemented through a method for synchronizing the synchronization signal of the to-be-processed signals, where the to-be-processed signals are signals changing periodically.

In order to form a basis for the following steps, the to-be-processed signals are first acquired.

As an implementation manner of this embodiment, the to-be-processed signal in this embodiment may be single-phase signals or three-phase signals.

302: Acquire time points with a same quantity at the same corresponding time in each period of the to-be-processed signal, where at least two of the time points are acquired in each period.

As an implementation manner of this embodiment, each period of the to-be-processed signals includes a positive zero-crossing point and/or a negative zero-crossing point, and the positive zero-crossing point or the negative zero-crossing point of the to-be-processed signal is acquired in each period of the to-be-processed signal. The acquired time point is the positive zero-crossing point and/or the negative zero-crossing point of the to-be-processed signal.

The acquired time point may include: the positive zero-crossing point, the negative zero-crossing point, a crest point, and a valley point.

The synchronization signal is formed by pulses generated at the time points, and in order that each period of the synchronization signal includes the pulses with the same quantity and the same corresponding location, each period of the to-be-processed signals includes time points with the same quantity that are acquired at the same corresponding time.

As an implementation manner of this embodiment, if a period of the to-be-processed signals is 21 milliseconds, a 7 millisecond time point, a 14 millisecond time point, and a 21 millisecond time point of a first period of the to-be-processed signals are acquired; and a 7 millisecond time point, a 14 millisecond time point, and a 21 millisecond time point of a corresponding second period of the to-be-processed signals, that is, a 28 millisecond time point, a 35 millisecond time point, and a 42 millisecond time point of the to-be-processed signals, are acquired. The time points of other periods are successively acquired according to the foregoing method.

As an implementation manner of this embodiment, if the to-be-processed signals are single-phase signals, a positive zero-crossing point and a negative zero-crossing point of the to-be-processed signals are acquired, and the positive zero-crossing point and the negative zero-crossing point are used as the time points with the same quantity that are acquired at the same corresponding time in each period of the to-be-processed signals. If the to-be-processed signals are three-phase signals, a positive zero-crossing point or a negative zero-crossing point of the signals of each phase in the three-phase signals are acquired, and the positive zero-crossing points or the negative zero-crossing points are used as the time points with the same quantity that are acquired in each period of the to-be-processed signals.

The time point is not specifically limited in this embodiment, and may be set according to an actual requirement, so the details are not described herein again.

303: Generate pulses at each of the time points through a pulse generation apparatus, where all the obtained pulses are used as the synchronization signal that has the same period as the to-be-processed signals.

Through the pulse generation apparatus, pulses are generated at each of the time points corresponding to the acquired to-be-processed signal, where all the obtained pulses are used as the synchronization signal that has the same period as the to-be-processed signals.

As each period of the to-be-processed signal includes the time points with the same quantity that are acquired at the same corresponding time in each period, each period of the synchronization signal includes the pulses with the same quantity and the same corresponding location.

Widths of the pulses generated at the time points that are acquired at the same corresponding time in the periods of the to-be-processed signal are the same.

As an implementation manner of this embodiment, if a period of the to-be-processed signals is 21 milliseconds, the period of the synchronization signal is also 21 milliseconds. The width of pulses generated at a 7 millisecond time point of a first period of the to-be-processed signals is the same as the width of pulses generated at a 7 millisecond time point of a corresponding second period of the to-be-processed signals, that is, the width of pulses generated at a 28 millisecond time point of the to-be-processed signals; and is also the same as the width of pulses generated at the same time point with the corresponding time of another period.

As an implementation manner of this embodiment, if the to-be-processed signals are single-phase signals and the acquired time points are the positive zero-crossing points and the negative zero-crossing points of the to-be-processed signals, the widths of the pulses generated at the positive zero-crossing points are the same, and the widths of the pulses generated at the negative zero-crossing points are the same. If the to-be-processed signals are three-phase signals and the acquired time points are the positive zero-crossing points of the signals of each phase in the to-be-processed signals, the widths of the pulses generated at the positive zero-crossing points of a signal of a certain phase in the to-be-processed signals are the same.

Further, among all the periods of the to-be-processed signals, the widths of the pulses generated at the time points that are acquired at different corresponding time are different.

As an implementation manner of this embodiment, if a period of the to-be-processed signals is 21 milliseconds, the period of the synchronization signal is also 21 milliseconds. The width of the pulses generated at a 7 millisecond time point of a first period of the to-be-processed signals is different from the width of the pulses generated at a 14 millisecond time point of a corresponding first period of the to-be-processed signals, and is also different from the width of the pulses generated at a time point with different corresponding time of another period.

As an implementation manner of this embodiment, if the to-be-processed signals are single-phase signals and the acquired time points are the positive zero-crossing points and the negative zero-crossing points of the to-be-processed signals, the width of the pulses generated at the positive zero-crossing point is different from the width of the pulses generated at the negative zero-crossing point. If the to-be-processed signals is a three-phase signal and the acquired time points are the positive zero-crossing points of the signals of each phase in the to-be-processed signals, the widths of the pulses generated at the positive zero-crossing points of the signal of a different phase in the to-be-processed signals are different.

Figure 4:
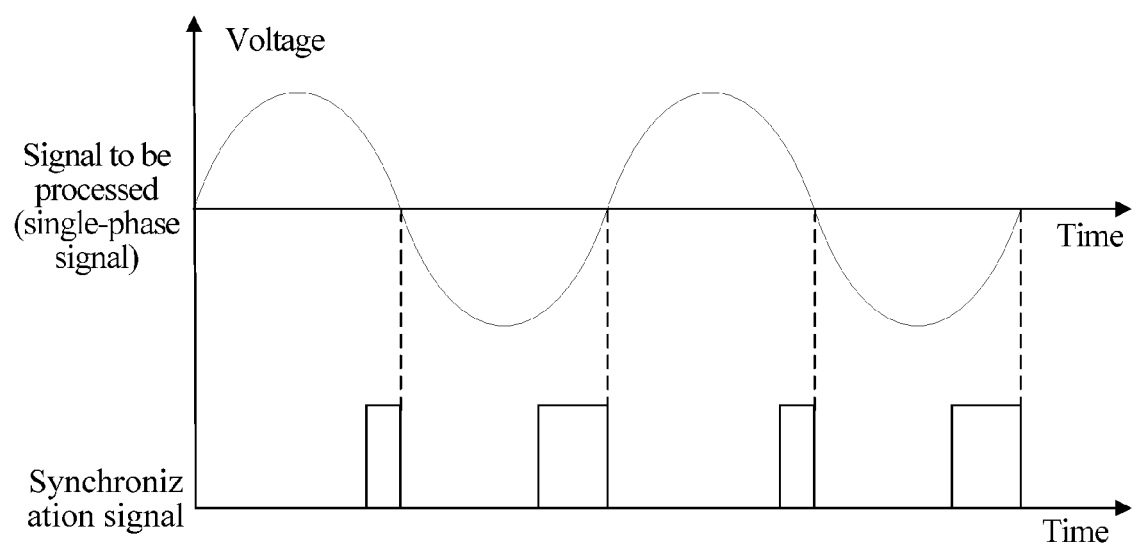
FIG. 4 is a waveform diagram of a single-phase signal and a synchronization signal thereof provided in an embodiment.

FIG. 4 is a waveform diagram of a to-be-processed signal and a synchronization signal of the to-be-processed signal when the to-be-processed signal is a single-phase signal.

Figure 5:
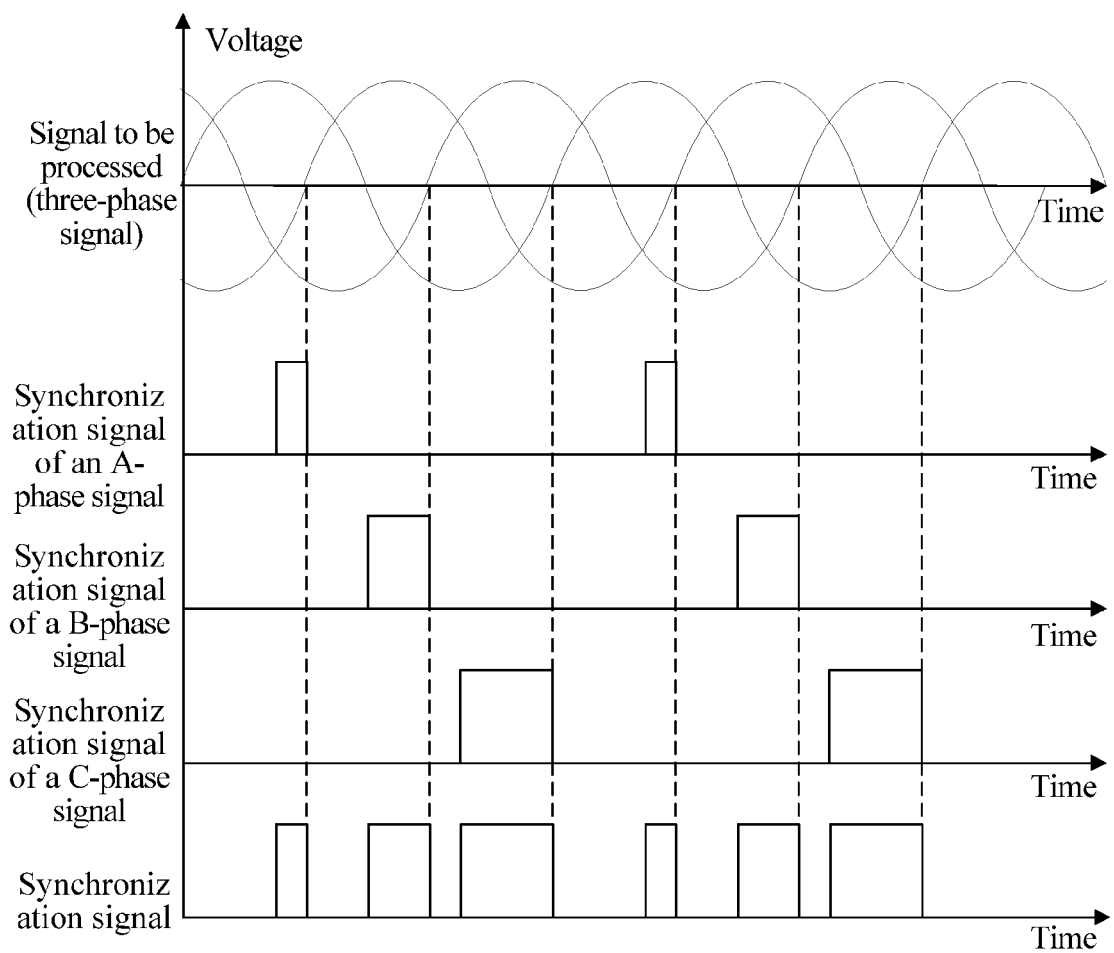
FIG. 5 is a waveform diagram of a three-phase signal and a synchronization signal thereof provided in an embodiment.

FIG. 5 is a waveform diagram of a to-be-processed signal and a synchronization signal of the to-be-processed signal when the to-be-processed signal is a three-phase signal. In FIG. 5, the to-be-processed signal is a three-phase signal, including: an A-phase signal, a B-phase signal, and a C-phase signal.

A pulse generation apparatus provided in this embodiment may be any apparatus including a pulse generation circuit.

The pulse generation apparatus is not limited in this embodiment, and may be any apparatus that is known by persons skilled in the art, so the details are not described herein again.

304: Detect whether the synchronization signal is normal by determining whether parameters of all the pulses in the synchronization signal are accurate.

The synchronization operation executed on the synchronization signal may include: synchronizing the synchronization signal and detecting the synchronization signal. The synchronization of the to-be-processed signals is implemented by synchronizing the synchronization signal of the to-be-processed signals. In order to more accurately synchronize the to-be-processed signals, the synchronization signal is first detected before the synchronization.

As an implementation manner of this embodiment, parameters of the pulses provided in this embodiment may be: a width of the pulse, an order of the pulse, and a time interval between pulses.

Further, it is determined whether the synchronization signal is normal according to a time interval between the pulses of the synchronization signal.

The detecting whether the synchronization signal is normal by determining whether the parameters of all the pulses in the synchronization signal are accurate may be: detecting whether the synchronization signal is normal by determining whether widths of all the pulses in the synchronization signal are within the preset range, and/or by determining whether the arrangement order of all the pulses in the synchronization signal is a preset order.

As an implementation manner of this embodiment, a time interval between rising edges/falling edges of two pulses in the synchronization signal is acquired, and then it is determined whether each time interval is within the preset range. If the interval is not within the preset range, it indicates that the synchronization signal is abnormal, and the synchronization signal is not used to synchronize the to-be-processed signals. If the interval is within the preset range, the width of each pulse in the synchronization signal is acquired, and then it is determined whether the width of each pulse is within the preset range. If the width of the pulses is within the preset range, it indicates that each pulse in the synchronization signal is normal, and the synchronization signal is also normal. If the width of the pulses is not within the preset range, it indicates that some pulses in the synchronization signal are abnormal, and the synchronization signal is abnormal.

Alternatively, it is determined whether the arrangement order of all the pulses in the synchronization signal is correct. If the arrangement order of all the pulses included in the synchronization signal is correct, it indicates that the synchronization signal is normal; and if the arrangement order of all the pulses included in the synchronization signal is incorrect, it indicates that the synchronization signal is abnormal.

Alternatively, it is detected whether the synchronization signal is normal according to the pulse width and the pulse arrangement order of the synchronization signal.

The parameters of the pulses are not limited in this embodiment, and may be set according to an actual requirement, so the details are not described herein again.

The synchronization signal detecting method is not limited in this embodiment, and may be any method that is known by persons skilled in the art, so the details are not described herein again.

305: If the synchronization signal is normal, perform time alignment on the pulses in the synchronization signal, so as to synchronize the to-be-processed signals.

The synchronization of the to-be-processed signals is implemented by synchronizing the synchronization signal of the to-be-processed signals.

As an implementation manner of this embodiment, the synchronization of the synchronization signal is implemented by performing time alignment on the rising edges/the falling edges of the pulses in the synchronization signal, so as to further implement synchronization of the to-be-processed signals.

Because at least two pulses are included in each period of the synchronization signal, in one period of the to-be-processed signal, that is, in one period of the synchronization signal, the synchronization operation may be performed on the synchronization signal at least twice, that is, in one period of the to-be-processed signal, synchronization may be performed on the to-be-processed signal at least twice, thereby improving the speed and accuracy of the synchronization operation.

The manner of time alignment performed on the synchronization signal is not limited in this embodiment, and may be any manner that is known by persons skilled in the art, so the details are not described herein again.

In the synchronization signal processing method provided in the embodiment of the present invention, synchronization of multiple to-be-processed signals of a power supply is implemented through a method for synchronizing the synchronization signal. In order to more accurately synchronize the to-be-processed signals, the synchronization signal is first detected before the to-be-processed signals are synchronized, where the detecting the synchronization signal is specifically performed by determining whether the pulses included in the synchronization signal are normal, and the number of the pulses included in the synchronization signal is the number of times the synchronization operation is executed on the synchronization signal.

After the foregoing solutions are adopted, at least two pulses are included in each period of the synchronization signal, so that in one period of the synchronization signal, the synchronization operation may be performed on the synchronization signal not less than twice, thereby improving accuracy and a speed of execution of the synchronization operation.

Figure 6:
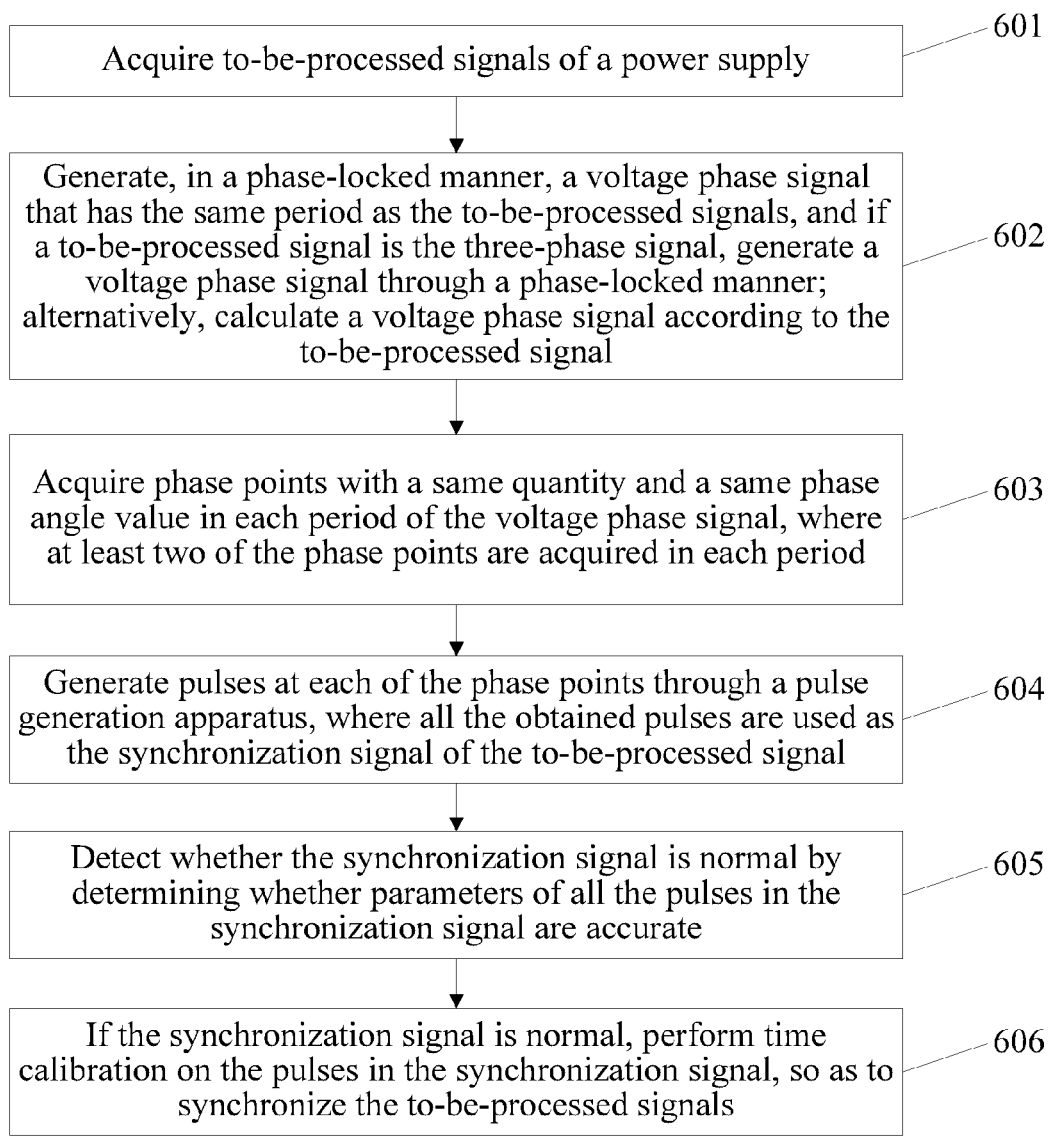
FIG. 6 is a flow chart of a synchronization signal processing method by generating a synchronization signal at a selected phase point provided in an embodiment.

As an improvement of the embodiment, this embodiment provides another synchronization signal processing method, which is shown in FIG. 6, and includes the following steps.

601: Acquire multiple to-be-processed signals of a power supply.

Before the to-be-processed signals are synchronized, a synchronization signal of the to-be-processed signals is generated according to the to-be-processed signals, and synchronization of the to-be-processed signals is implemented through a method for synchronizing the synchronization signal of the to-be-processed signals, where the to-be-processed signals are signals changing periodically.

In order to form a basis for the following steps, the to-be-processed signals are first acquired.

As an implementation manner of this embodiment, the to-be-processed signal in this embodiment may be a single-phase signal or a three-phase signal.

602: Generate, in a phase-locked manner, a voltage phase signal that has the same period as the to-be-processed signals, and if a to-be-processed signal is the three-phase signal, generate a voltage phase signal through a phase-locked manner; alternatively, calculate a voltage phase signal according to the to-be-processed signal.

As an implementation manner of this embodiment, the method for acquiring the voltage phase signal of the to-be-processed signal may include: directly calculating the voltage phase signal of the to-be-processed signal according to the to-be-processed signal, or generating the voltage phase signal of the to-be-processed signal in the phase-locked manner.

As an implementation manner of this embodiment, if a to-be-processed signal is the single-phase signal, the voltage phase signal of the to-be-processed signal is generated in the phase-locked manner; and if a to-be-processed signal is the three-phase signal, the voltage phase signal of the to-be-processed signal may be directly calculated, or the voltage phase signal of the to-be-processed signal is generated in the phase-locked manner.

The method for acquiring the voltage phase signal method is not limited in this embodiment, and may be any method that is known by persons skilled in the art, so the details are not described herein again.

The phase-locked manner provided in this embodiment is known by persons skilled in the art, so the details are not described herein again.

603: Acquire phase points with a same quantity and a same phase angle value in each period of the voltage phase signal, where at least two of the phase points are acquired in each period.

As an implementation manner of this embodiment, a phase angle value of each period of the voltage phase signal may be 0 degrees to 360 degrees, and the acquired phase points may include: a 120 degree point, a 240 degree point, and a 360 degree point.

The synchronization signal is formed by pulses generated at the phase points, and in order that each period of the synchronization signal includes the pulses with the same quantity and the same corresponding location, each period of the voltage phase signal includes phase points with the same quantity and the same phase angle value in each period of the voltage phase signal.

Figure 7:
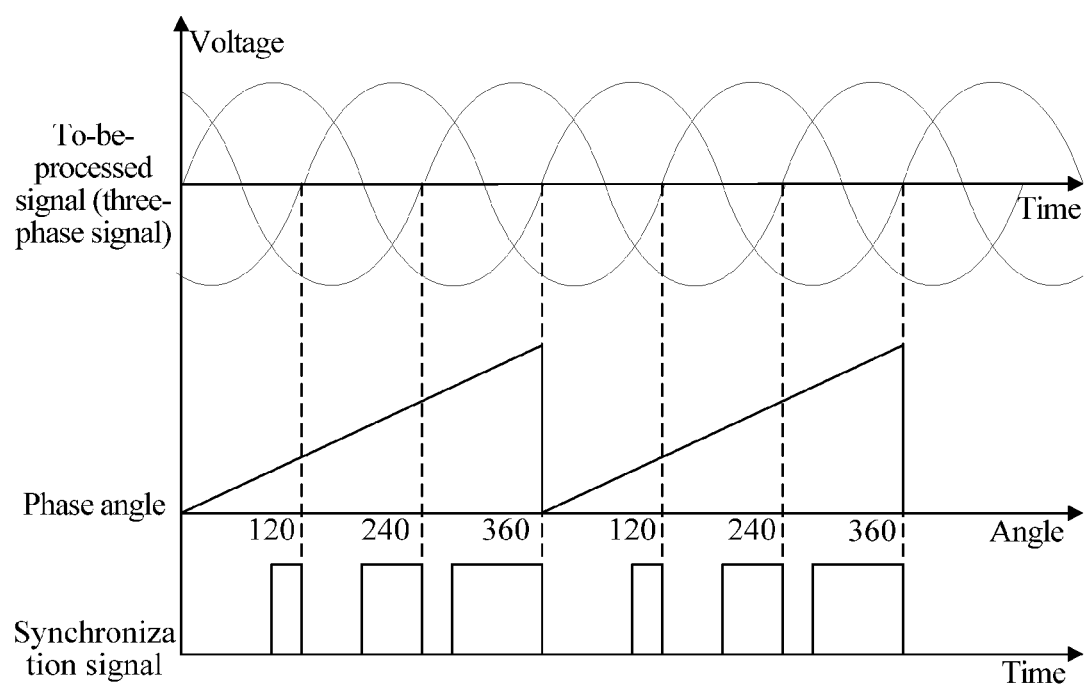
FIG. 7 is a waveform diagram of a three-phase signal and a synchronization signal thereof when the synchronization signal is generated at a selected phase point provided in an embodiment.
Figure 8:
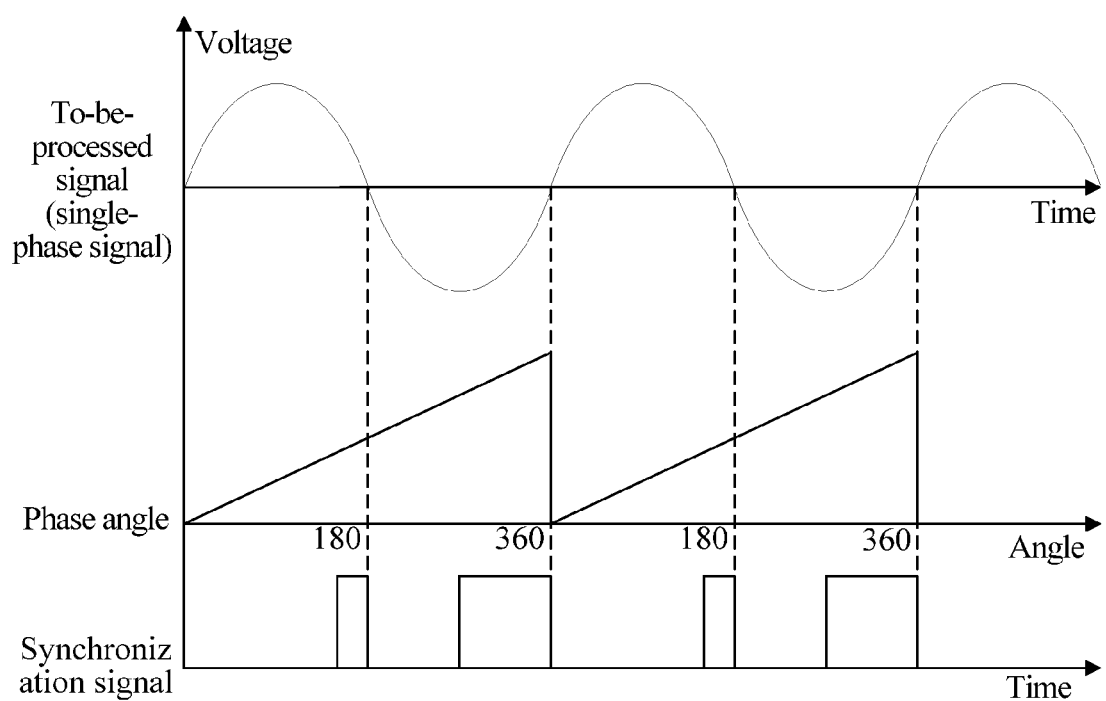
FIG. 8 is a waveform diagram of a single-phase signal and a synchronization signal thereof when the synchronization signal is generated at a selected phase point provided in an embodiment.

As an implementation manner of this embodiment, and as shown in FIG. 7, if the to-be-processed signals are the three-phase signals, a 120 degree point, a 240 degree point, and a 360 degree point are acquired in each period of the voltage phase signal. As shown in FIG. 8, if a to-be-processed signal is the single-phase signal, a 180 degree point and a 360 degree point are acquired in each period of the voltage phase signal.

The selection of the phase points is not limited in this embodiment, and may be set according to an actual requirement, so the details are not described herein again.

604: Generate pulses at each of the phase points through a pulse generation apparatus, where all the obtained pulses are used as the synchronization signal of the to-be-processed signal.

One pulse is generated at each of the phase points corresponding to the obtained voltage phase signal, where all the obtained pulses are used as the synchronization signal of the to-be-processed signal.

As each period of the voltage phase signal includes the phase points with the same quantity and the same phase angle value among all the periods of the voltage phase signal, each period of the synchronization signal includes the pulses with the same quantity and the same corresponding location.

The widths of the pulses generated at the time points that have the same phase angle value among all the periods of the voltage phase signal are the same.

As an implementation manner of this embodiment, if the 120 degree point, the 240 degree point, and the 360 degree point are acquired in each period of the voltage phase signal, one pulse is generated at each of the 120 degree point, the 240 degree point, and the 360 degree point in each period of the voltage phase signal. The widths of the pulses generated at the 120 degree point in each period of the voltage phase signal are the same, the widths of the pulses generated at the 240 degree point in each period of the voltage phase signal are the same, and the widths of the pulses generated at the 360 degree point in each period of the voltage phase signal are the same.

Further, among all the periods of the voltage phase signal, the widths of the pulses generated at the phase points that have different phase angle values are different.

As an implementation manner of this embodiment, if the 120 degree point, the 240 degree point, and the 360 degree point are acquired in each period of the voltage phase signal, one pulse is generated at each of the 120 degree point, the 240 degree point, and the 360 degree point in each period of the voltage phase signal, and the widths of the pulses generated at the 120 degree point, the 240 degree point, and the 360 degree point in each period of the voltage phase signal are different.

FIG. 7 is a waveform diagram of a three-phase signal and a synchronization signal of the three-phase signal when the synchronization signal is generated at a selected phase point.

FIG. 8 is a waveform diagram of a single-phase signal and a synchronization signal of the single-phase signal when the synchronization signal is generated at a selected phase point.

605: Detect whether the synchronization signal is normal by determining whether parameters of all the pulses in the synchronization signal are accurate.

The synchronization operation executed on the synchronization signal may include: synchronizing the synchronization signal and detecting the synchronization signal. The synchronization of the to-be-processed signals is implemented by synchronizing the synchronization signal of the to-be-processed signals. In order to more accurately synchronize the to-be-processed signals, the synchronization signal is first detected before the synchronization.

Further, it is determined whether the synchronization signal is normal according to a time interval between the pulses of the synchronization signal.

The detecting whether the synchronization signal is normal by determining whether the parameters of all the pulses in the synchronization signal are accurate may be: detecting whether the synchronization signal is normal by determining whether widths of all the pulses in the synchronization signal are within the preset range, and/or by determining whether the arrangement order of all the pulses in the synchronization signal is a preset order.

As an implementation manner of this embodiment, a time interval between rising edges/falling edges of two pulses in the synchronization signal is acquired, and then it is determined whether each time interval is within the preset range. If the interval is not within the preset range, it indicates that the synchronization signal is abnormal, and the synchronization signal is not used to synchronize the to-be-processed signals. If the interval is within the preset range, the width of each pulse in the synchronization signal is acquired, and then it is determined whether the width of each pulse is within the preset range. If the width of the pulses is within the preset range, it indicates that each pulse in the synchronization signal is normal, and the synchronization signal is also normal. If the width of the pulses is not within the preset range, it indicates that some pulses in the synchronization signal are abnormal, and the synchronization signal is abnormal.

Alternatively, it is determined whether the arrangement order of all the pulses in the synchronization signal is correct. If the arrangement order of all the pulses included in the synchronization signal is correct, it indicates that the synchronization signal is normal; and if the arrangement order of all the pulses included in the synchronization signal is incorrect, it indicates that the synchronization signal is abnormal.

The synchronization signal detecting method is not limited in this embodiment, and may be any method that is known by persons skilled in the art, so the details are not described herein again.

606: If the synchronization signal is normal, perform time alignment on the pulses in the synchronization signal, so as to synchronize the to-be-processed signals.

The synchronization of the to-be-processed signals is implemented by synchronizing the synchronization signal of the to-be-processed signals.

As an implementation manner of this embodiment, the synchronization of the synchronization signal is implemented by performing time alignment on the rising edges/the falling edges of the pulses in the synchronization signal, so as to further implement synchronization of the to-be-processed signals.

Because at least two pulses are included in each period of the synchronization signal, in one period of the to-be-processed signal, that is, in one period of the synchronization signal, the synchronization operation may be performed on the synchronization signal at least twice, that is, in one period of the to-be-processed signal, synchronization may be performed on the to-be-processed signal at least twice, thereby improving the speed and accuracy of the synchronization operation.

The manner of time alignment performed on the synchronization signal is not limited in this embodiment, and may be any manner that is known by persons skilled in the art, so the details are not described herein again.

In the synchronization signal processing method provided in the embodiment of the present invention, synchronization of multiple to-be-processed signals of a power supply is implemented through a method for synchronizing the synchronization signal. In order to more accurately synchronize the to-be-processed signals, the synchronization signal is first detected before the to-be-processed signals are synchronized, where the detecting the synchronization signal is specifically performed by determining whether the pulses included in the synchronization signal are normal, and the number of the pulses included in the synchronization signal is the number of times the synchronization operation is executed on the synchronization signal.

After the foregoing solutions are adopted, at least two pulses are included in each period of the synchronization signal, so that in one period of the synchronization signal, the synchronization operation may be performed on the synchronization signal at least twice, thereby improving accuracy and a speed of the synchronization operation.

Figure 9:
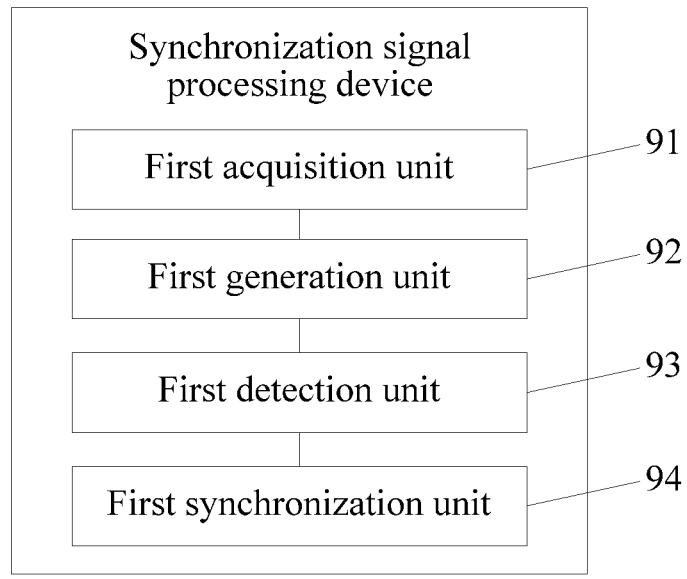
FIG. 9 is a schematic structural diagram of a synchronization signal processing apparatus provided in an embodiment.

This embodiment provides a synchronization signal processing apparatus, which is shown in FIG. 9, and includes: a first acquisition unit 91, a first generation unit 92, a first detection unit 93, and a first synchronization unit 94.

The first acquisition unit 91 is configured to acquire multiple to-be-processed signals of a power supply, where the to-be-processed signals are signals changing periodically.

The first generation unit 92 is configured to generate a synchronization signal that has the same period as the to-be-processed signals by generating pulses in each period of the to-be-processed signals and acquired by the first acquisition unit, where at least two pulses are included in each period of the synchronization signal.

The first detection unit 93 is configured to detect whether the synchronization signal is normal by determining whether parameters of all the pulses in the synchronization signal generated by the first generation unit are accurate.

The first synchronization unit 94 is configured to perform time alignment on the pulses in the synchronization signal if the first detection unit detects that the synchronization signal is normal, so as to synchronize the to-be-processed signals.

The synchronization signal processing apparatus provided in the embodiment of the present invention may execute the following synchronization operations on the synchronization signal: synchronizing the synchronization signal and detecting the synchronization signal. The first synchronization unit implements the synchronization of the to-be-processed signals through a method for synchronizing the synchronization signal. In order to more accurately synchronize the to-be-processed signals, the first detection unit first detects the synchronization signal before the synchronization. The detecting the synchronization signal by the first detection unit is specifically performed by determining whether the pulses included in the synchronization signal are normal, where the number of the pulses included in one period of the synchronization signal is the number of times the synchronization operation is executed on the synchronization signal in one period of the synchronization signal.

After the foregoing solutions are adopted, at least two pulses are included in each period of the synchronization signal, so that in one period of the synchronization signal, the synchronization operation may be performed on the synchronization signal not less than twice, thereby improving accuracy and a speed of execution of the synchronization operation.

Figure 10:
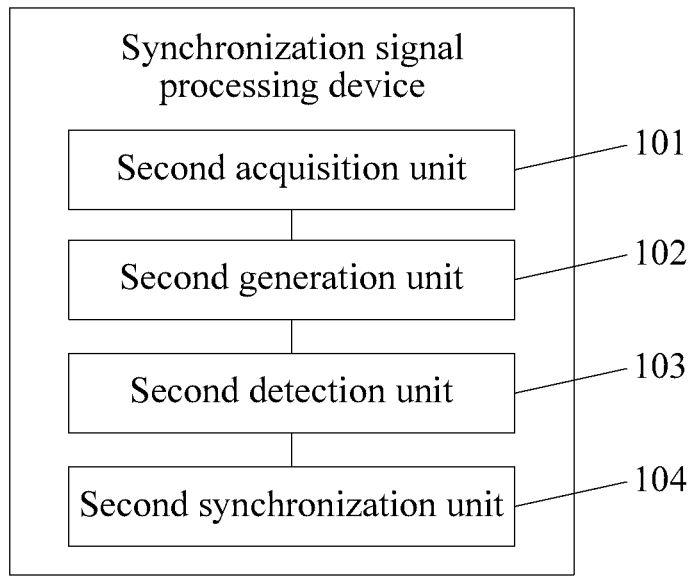
FIG. 10 is a schematic structural diagram of a synchronization signal processing apparatus adopting another synchronization signal detecting method provided in an embodiment.

This embodiment provides another synchronization signal processing apparatus, which is shown in FIG. 10, and includes: a second acquisition unit 101, a second generation unit 102, a second detection unit 103, and a second synchronization unit 104.

The second acquisition unit 101 is configured to acquire multiple to-be-processed signals of a power supply, where the to-be-processed signals are signals changing periodically.

The second generation unit 102 is configured to generate a synchronization signal that has the same period as the to-be-processed signals by generating pulses in each period of the to-be-processed signals and acquired by the second acquisition unit, where the to-be-processed signals include at least one of the pulses.

The second detection unit 103 is configured to detect whether the synchronization signal is normal by determining whether widths of all the pulses in the synchronization signal generated by the second generation unit are within a preset range.

The second synchronization unit 104 is configured to perform time alignment on the pulses in the synchronization signal if the second detection unit detects that the synchronization signal is normal, so as to synchronize the to-be-processed signals.

After the foregoing solutions are adopted, it can be determined whether the time interval between the multiple pulses in the synchronization signal is normal, and it can be further determined whether a single pulse in the synchronization signal is normal, thereby improving accuracy of the synchronization operation.

Figure 11:
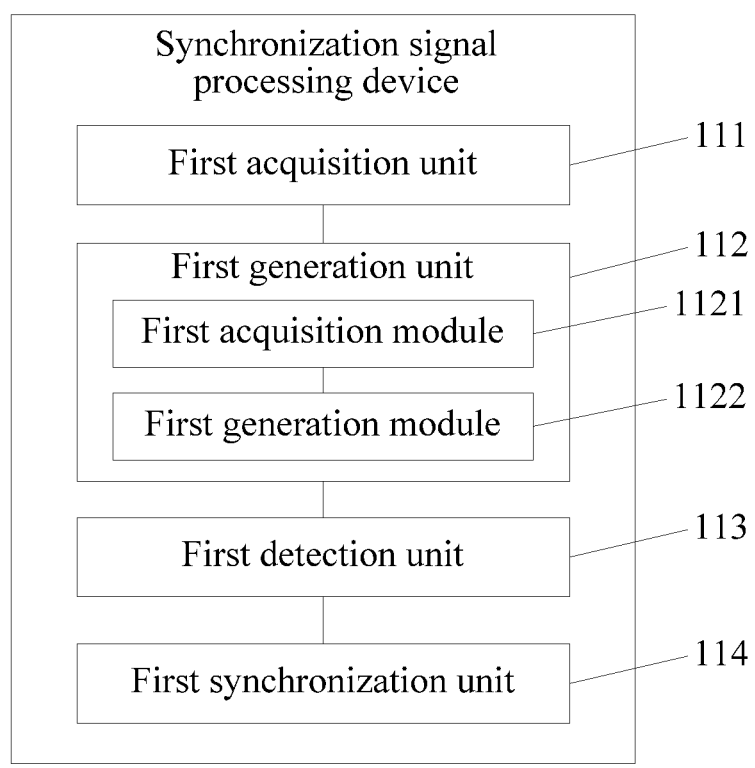
FIG. 11 is a schematic structural diagram of another synchronization signal processing apparatus provided in an embodiment.

This embodiment provides another synchronization signal processing apparatus, which is shown in FIG. 11, and includes: a first acquisition unit 111, a first generation unit 112, a first detection unit 113, and a first synchronization unit 114.

Specifically, the first generation unit 112 includes a first acquisition module 1121 and a first generation module 1122.

The first acquisition unit 111 is configured to acquire multiple to-be-processed signals of a power supply, where the to-be-processed signals are signals changing periodically.

Before the to-be-processed signals are synchronized, a synchronization signal of the to-be-processed signals is first generated according to the to-be-processed signals, and the synchronization of the to-be-processed signals is implemented through a method for synchronizing the synchronization signal of the to-be-processed signals.

In order to form a basis for the following steps, the first acquisition unit first acquires the to-be-processed signals.

As an implementation manner of this embodiment, the to-be-processed signal may be a single-phase signal or a three-phase signal.

The first generation unit 112 is configured to generate a synchronization signal that has the same period as the to-be-processed signals by generating pulses in each period of the to-be-processed signals and acquired by the first acquisition unit, where at least two pulses are included in each period of the synchronization signal.

Specifically, the first acquisition module 1121 is configured to acquire time points with the same quantity at the same corresponding time in each period of the to-be-processed signals, where at least two of the time points are acquired in each period.

As an implementation manner of this embodiment, each period of the to-be-processed signals includes a positive zero-crossing point and/or a negative zero-crossing point, and the positive zero-crossing point or the negative zero-crossing point of the to-be-processed signal is acquired in each period of the to-be-processed signal. At this time, the acquired time point is the positive zero-crossing point and/or the negative zero-crossing point of the to-be-processed signal.

The time point acquired by the first acquisition module may include: a positive zero-crossing point, a negative zero-crossing point, a crest point, and a valley point.

The synchronization signal is formed by pulses generated at the time points, and in order that each period of the synchronization signal includes the pulses with the same quantity and the same corresponding location, each period of the to-be-processed signal includes time points with the same quantity at the same corresponding time in the periods.

The first generation module 1122 is configured to generate pulses, through a pulse generation apparatus, at each of the time points acquired by the first acquisition module, where the obtained pulses are used as the synchronization signal that has the same period as the to-be-processed signals, and the widths of the pulses generated at the time points that are acquired at the same corresponding time in each period are the same.

The first generation module generates, through the pulse generation apparatus, one pulse at each acquired time point of the to-be-processed signals, where all the obtained pulses are used as the synchronization signal that has the same period as the to-be-processed signals.

As each period of the to-be-processed signal includes the time points with the same quantity at the same corresponding time in the periods, each period of the synchronization signal includes the pulses with the same quantity and the same corresponding location.

At the time points that are acquired at the same corresponding time in periods of the to-be-processed signal, the widths of the pulses generated by the first generation module are the same.

Further, among all the periods of the to-be-processed signal, at the time points that are acquired at different corresponding time in periods, the widths of the pulses generated by the first generation module are different.

The first detection unit 113 is configured to detect whether the synchronization signal is normal by determining whether parameters of all the pulses in the synchronization signal generated by the first generation unit are accurate.

The synchronization operation executed on the synchronization signal may include: synchronizing the synchronization signal and detecting the synchronization signal. The synchronization of the to-be-processed signals is implemented by synchronizing the synchronization signal of the to-be-processed signals. In order to more accurately synchronize the to-be-processed signals, the first detection unit first detects the synchronization signal before the synchronization.

Further, the first detection unit determines whether the synchronization signal is normal according to the pulse width, a pulse arrangement order, and a time interval between the pulses of the synchronization signal.

The first synchronization unit 114 is configured to perform time alignment on the pulses in the synchronization signal if the first detection unit detects that the synchronization signal is normal, so as to synchronize the to-be-processed signals.

The first synchronization unit implements synchronization of the to-be-processed signals through a method for synchronizing the synchronization signal of the to-be-processed signals.

As an implementation manner of this embodiment, the first synchronization unit implements the synchronization of the synchronization signal by performing time alignment on the rising edges/the falling edges of the pulses in the synchronization signal, so as to further implement synchronization of the synchronization signal.

In the synchronization signal processing apparatus provided in the embodiment of the present invention, the first synchronization unit implements the synchronization of the to-be-processed signals through a method for synchronizing the synchronization signal. In order to more accurately synchronize the to-be-processed signals, the first detection unit first detects the synchronization signal before the synchronization. The detecting the synchronization signal by the first detection unit is specifically performed by determining whether the pulses included in the synchronization signal are normal, where the number of the pulses included in one period of the synchronization signal is the number of times the synchronization operation is executed on the synchronization signal in one period of the synchronization signal.

After the foregoing solutions are adopted, at least two pulses are included in each period of the synchronization signal, so that in one period of the synchronization signal, the first detection unit may perform the synchronization operation on the synchronization signal at least twice, thereby improving the accuracy and speed of the synchronization operation.

Figure 12:
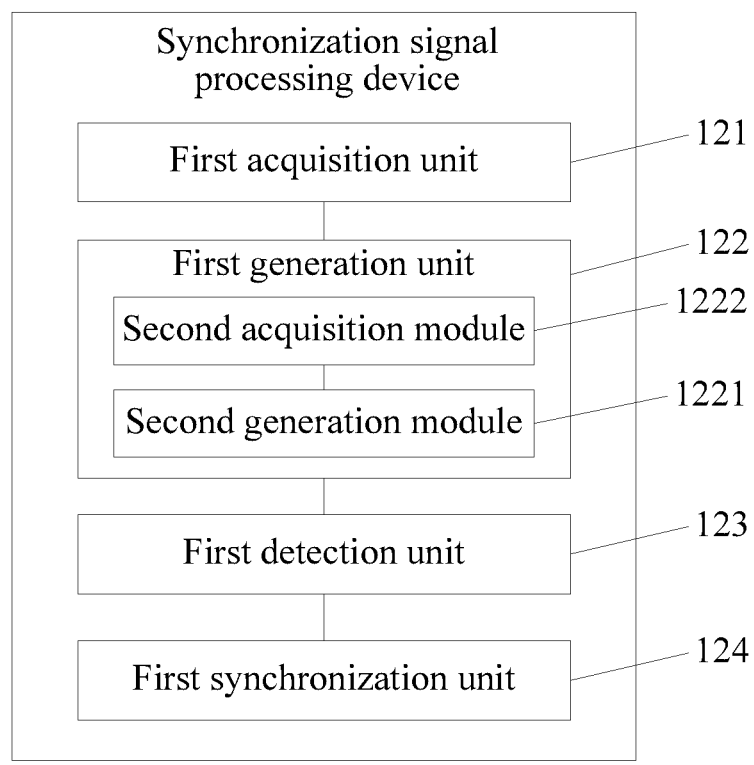
FIG. 12 is a schematic structural diagram of a synchronization signal processing apparatus when the synchronization signal is generated at a selected phase point provided in an embodiment.

This embodiment provides another synchronization signal processing apparatus, which is shown in FIG. 12, and includes: a first acquisition unit 121, a first generation unit 122, a first detection unit 123, and a first synchronization unit 124.

Specifically, the first generation unit 122 includes a second generation module 1221, a second acquisition module 1222, and a third generation module.

The first acquisition unit 121 is configured to acquire multiple to-be-processed signals of a power supply, where the to-be-processed signals are signals changing periodically.

Before the to-be-processed signals are synchronized, a synchronization signal of the to-be-processed signals is first generated according to the to-be-processed signals, and the synchronization of the to-be-processed signals is implemented through a method for synchronizing the synchronization signal of the to-be-processed signals.

In order to form a basis for the following steps, the first acquisition unit first acquires the to-be-processed signals.

As an implementation manner of this embodiment, the to-be-processed signal may be a single-phase signal or a three-phase signal.

The first generation unit 122 is configured to generate a synchronization signal that has the same period as the to-be-processed signals by generating pulses in each period of the to-be-processed signals and acquired by the first acquisition unit, where at least two pulses are included in each period of the synchronization signal.

Specifically, the second generation module 1221 is configured to generate, in a phase-locked manner, a voltage phase signal that has the same period as the to-be-processed signals, and if a to-be-processed signal is a three-phase signal, generate the voltage phase signal in the phase-locked manner, or calculate the voltage phase signal according to the to-be-processed signals.

As an implementation manner of this embodiment, the method for acquiring the voltage phase signal by the second generation module may include: directly calculating, by the second generation module, the voltage phase signal according to the to-be-processed signal, or generating, by the second generation module, the voltage phase signal in the phase-locked manner.

As an implementation manner of this embodiment, if a to-be-processed signal is the single-phase signal, the second generation module generates, in the phase-locked manner, the voltage phase signal of the to-be-processed signal; and if a to-be-processed signal is the three-phase signal, the second generation module directly calculates the voltage phase signal of the to-be-processed signal, or generates the voltage phase signal in the phase-locked manner.

The method for generating the voltage phase signal by the second generation module is not limited in this embodiment, and may be any method that is known by persons skilled in the art, so the details are not described herein again.

The phase-locked manner provided in this embodiment is known by persons skilled in the art, so the details are not described herein again.

The second acquisition module 1222 is configured to acquire phase points with the same quantity and the same phase angle value in each period of the voltage phase signal, where at least two of the phase points are acquired in each period.

The third generation module is configured to generate pulses at each of the phase points through a pulse generation apparatus, where all the obtained pulses are used as the synchronization signal that has the same period as the to-be-processed signals, and widths of the pulses generated at the phase points that have the same phase angle value among all the periods of the voltage phase signal are the same.

The third generation module generates one pulse at each of the phase points of the voltage phase signal, where all the obtained pulses are used as the synchronization signal of the to-be-processed signal.

Because each period of the voltage phase signal includes the phase points with the same quantity and the same phase angle value among all the periods of the voltage phase signal, each period of the synchronization signal includes the pulses with the same quantity and the same corresponding location.

The widths of the pulses generated by the third generation module at the time points that have the same phase angle value among all the periods of the voltage phase signal are the same.

Further, among all the periods of the voltage phase signal, the widths of the pulses generated by the third generation module at the time points that have different phase angle values are different.

The first detection unit 123 is configured to detect whether the synchronization signal is normal by determining whether parameters of all the pulses in the synchronization signal generated by the first generation unit are accurate.

The synchronization operation executed on the synchronization signal may include: synchronizing the synchronization signal and detecting the synchronization signal. The synchronization of the to-be-processed signals is implemented by synchronizing the synchronization signal of the to-be-processed signals. In order to more accurately synchronize the to-be-processed signals, the first detection unit first detects the synchronization signal before the synchronization.

Further, the first detection unit determines whether the synchronization signal is normal according to the pulse width, a pulse arrangement order, and a time interval between the pulses of the synchronization signal.

The first synchronization unit 124 is configured to perform time alignment on the pulses in the synchronization signal if the first detection unit detects that the synchronization signal is normal, so as to synchronize the to-be-processed signals.

The first synchronization unit implements the synchronization of the to-be-processed signals through a method for synchronizing the synchronization signal of the to-be-processed signals, that is, implements synchronization operation between multiple power supplies.

As an implementation manner of this embodiment, the first synchronization unit implements the synchronization of the synchronization signal by synchronizing the rising edges/the falling edges of the pulses in the synchronization signal, so as to further implement the synchronization of the to-be-processed signals.

In the synchronization signal processing apparatus provided in the embodiment of the present invention, synchronization of multiple to-be-processed signals of a power supply is implemented through a method for synchronizing the synchronization signal. In order to more accurately synchronize the to-be-processed signals, the synchronization signal is first detected before the to-be-processed signals are synchronized, where the detecting the synchronization signal is specifically performed by determining whether the pulses included in the synchronization signal are normal, and the number of the pulses included in the synchronization signal is the number of times the synchronization operation is executed on the synchronization signal.

After the foregoing solutions are adopted, at least two pulses are included in each period of the synchronization signal, so that in one period of the synchronization signal, the synchronization operation may be performed on the synchronization signal at least twice, thereby improving accuracy and a speed of the synchronization operation.

Through the description of the foregoing implementation manners, persons skilled in the art may clearly understand that the present invention may be implemented through software and hardware, for example: a microprocessor and a programmable logic device. Based on such an understanding, the technical solutions of the present invention essentially, or the part contributing to the prior art may be implemented in the form of a software product. The computer software product is stored in a readable storage medium, for example, a floppy disk, hard disk, or optical disk of the computer, and includes several instructions for instructing a computer device (which may be a personal computer, a server, or a network device) to perform the methods described in the embodiments of the present invention.

The foregoing descriptions are merely specific embodiment of the present invention, but are not intended to limit the protection scope of the present invention. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A synchronization signal processing method, comprising:
   acquiring multiple to-be-processed signals of a power supply, wherein the to-be-processed signals are signals changing periodically;
   generating a synchronization signal that has a same period as the to-be-processed signals by generating pulses in each period of the to-be-processed signals, wherein at least two pulses are comprised in each period of the synchronization signal;
   detecting whether the synchronization signal is normal by determining whether parameters of all the pulses in the synchronization signal are accurate; and
   performing time alignment on the pulses in the synchronization signal to synchronize the to-be-processed signals when the synchronization signal is normal,
   wherein generating the synchronization signal that has the same period as the to-be-processed signals by generating the pulses in each period of the to-be-processed signals further comprises:
   generating, in a phase-locked manner, a voltage phase signal that has the same period as the to-be-processed signals, and when a to-be-processed signal is a three-phase signal, generating the voltage phase signal in the phase-locked manner, or calculating the voltage phase signal according to the to-be-processed signals;
   acquiring phase points with a same number and a same phase angle value in each period of the voltage phase signal, wherein at least two of the phase points are acquired in each period; and
   generating pulses at each of the phase points through a pulse generation apparatus, wherein all the obtained pulses are used as the synchronization signal that has the same period as the to-be-processed signals, and wherein widths of the pulses generated at the phase points that have the same phase angle value among all the periods of the voltage phase signal are the same.

2. The synchronization signal processing method according to claim 1, wherein among all the periods of the voltage phase signal, widths of the pulses generated at the phase points that have different phase angle values are different.

3. A synchronization signal processing apparatus, comprising:
   a first acquisition unit configured to acquire multiple to-be-processed signals of a power supply, wherein the to-be-processed signals are signals changing periodically;
   a first generation unit configured to generate a synchronization signal that has a same period as the to-be-processed signals by generating pulses in each period of the to-be-processed signals and acquired by the first acquisition unit, wherein at least two pulses are comprised in each period of the synchronization signal;
   a first detection unit configured to detect whether the synchronization signal is normal by determining whether parameters of all the pulses in the synchronization signal generated by the first generation unit are accurate; and
   a first synchronization unit configured to perform time alignment on the pulses in the synchronization signal when the first detection unit detects that the synchronization signal is normal, so as to synchronize the to-be-processed signals,
   wherein the first generation unit further comprises:
   a second generation module configured to generate, in a phase-locked manner, a voltage phase signal that has the same period as the to-be-processed signals, and when a to-be-processed signal is a three-phase signal, generate the voltage phase signal in the phase-locked manner, or calculate the voltage phase signal according to the to-be-processed signals;
   a second acquisition module configured to acquire phase points with a same number and a same phase angle value in each period of the voltage phase signal, wherein at least two of the phase points are acquired in each period; and
   a third generation module configured to generate pulses at each of the phase points through a pulse generation apparatus, wherein all the obtained pulses are used as the synchronization signal that has the same period as the to-be-processed signals, and wherein widths of the pulses generated at the phase points that have the same phase angle value among all the periods of the voltage phase signal are the same.

4. The synchronization signal processing apparatus according to claim 3, wherein among all the periods of the voltage phase signal, the widths of the pulses generated by the third generation module at the phase points that have different phase angle values are different.

* * * * *